United States Patent
Inuiya

(10) Patent No.: US 8,237,834 B2
(45) Date of Patent: *Aug. 7, 2012

(54) SOLID-STATE IMAGING DEVICE AND IMAGING APPARATUS HAVING LIGHT-PREVENTING PARTITIONS

(75) Inventor: Masafumi Inuiya, Kanagawa (JP)

(73) Assignee: Fujifilm Corporation (JP)

( * ) Notice: Subject to any disclaimer, the term of this patent is extended or adjusted under 35 U.S.C. 154(b) by 397 days.

This patent is subject to a terminal disclaimer.

(21) Appl. No.: 12/557,964

(22) Filed: Sep. 11, 2009

(65) Prior Publication Data
US 2010/0060769 A1 Mar. 11, 2010

(30) Foreign Application Priority Data
Sep. 11, 2008 (JP) ................ P2008-233316

(51) Int. Cl.
*H04N 3/14* (2006.01)
*H04N 5/335* (2011.01)

(52) U.S. Cl. ......... 348/294; 348/272; 257/291; 257/440

(58) Field of Classification Search ............. 348/294, 348/340, 272–280; 257/184, 187, 225, 229–231, 257/432, 440, 257–258; 438/70
See application file for complete search history.

(56) References Cited

U.S. PATENT DOCUMENTS
2005/0195318 A1* 9/2005 Komatsu et al. ............. 348/370
2007/0096232 A1* 5/2007 Hwang ....................... 257/431
2008/0079807 A1* 4/2008 Inuiya et al. .................. 348/70

FOREIGN PATENT DOCUMENTS
JP 2005-347475 A 12/2005

* cited by examiner

Primary Examiner — Nelson D. Hernández Hernández
(74) Attorney, Agent, or Firm — Studebaker & Brackett PC; Donald R. Studebaker

(57) ABSTRACT

A solid-state imaging device includes a substrate and a plurality of pixel portions arranged over the substrate, each of the pixel portions includes a photoelectric conversion portion provided over the substrate and a color filter provided over the photoelectric conversion portion, and the solid-state imaging device includes partitions for preventing light that is incident on the color filter of each pixel portion from entering adjacent pixel portions.

7 Claims, 4 Drawing Sheets

SOLID-STATE IMAGING DEVICE AND IMAGING APPARATUS HAVING LIGHT-PREVENTING PARTITIONS

CROSS-REFERENCE TO RELATED APPLICATIONS

This application claims the benefit of Japanese Patent Application JP2008-233316, filed Sep. 11, 2008, the entire content of which is hereby incorporated by reference, the same as if set forth at length.

FIELD OF THE INVENTION

The present invention relates to a solid-state imaging device having many pixel portions arranged over a substrate and an imaging apparatus having such a solid-state imaging device.

BACKGROUND OF THE INVENTION

Stacked color imaging devices are known which have a layer of an organic photoelectric conversion material or an inorganic photoelectric conversion material such as amorphous silicon or a compound semiconductor and mosaic color filters disposed over the photoelectric conversion layer (refer to JP-A-2005-347475 and Hitachi, Ltd., "Single-plate Color Solid-state Imaging Device Using Amorphous Si," ITEJ Technical Report TEBS76-1-1). The photoelectric conversion layer absorbs visible light and generates signal charges.

In such stacked color imaging devices, what is called a panchromatic photoelectric conversion layer which is sensitive in the entire visible range is sandwiched between pixel electrodes and a transparent counter electrode and mosaic color filters are laid on the transparent counter electrode with a protective layer interposed in between. The mosaic filters are an arrangement of color filters that correspond to the respective pixel portions and each of which transmits R, G, or B light or Cy, Mg, or Ye light. Light shining on the imaging device is separated by the mosaic filters on a pixel-by-pixel basis into R, G, and B light beams or Cy, Mg, and Ye light beams, which are converted into signal charges by the photoelectric conversion layer. The signal charges generated by the photoelectric conversion layer are collected by the pixel electrodes, stored in charge storage diodes formed in a silicon substrate for a prescribed time via plugs that are connected to the pixel electrodes, and read out by readout circuits such as CMOS circuits or a CCD.

In such stacked color imaging devices, potential gradients are formed by applying a bias voltage between the pixel electrodes and the transparent counter electrode and almost all of signal charges generated in the photoelectric conversion layer are read out to the pixel electrode side. Therefore, a high-sensitivity imaging device having high efficiency of light utilization (the aperture ratio is close to 1) by setting the gaps between the pixel electrodes small. However, if there exists a certain distance between the photoelectric conversion layer and the mosaic color filters, light that is incident on each pixel portion obliquely may leak into adjacent pixel portions to cause color contamination.

Conventional stacked color imaging devices in which each pixel portion measures 3 to 10 μm for the mosaic color filters, the protective layer, and the panchromatic photoelectric conversion layer being 0.6 to 1.2 μm, 0.2 to 0.5 μm, and 0.3 to 1.0 μm in thickness, respectively, rarely suffer color contamination because of a small ratio of leakage of oblique incident light into adjacent pixel portions. However, the problem of color contamination will not be negligible when the degree of miniaturization of the pixel portions is increased and each pixel portion comes to measure less than 2 μm, in particular, around 1 μm, in the future.

SUMMARY OF THE INVENTION

The present invention has been made in the above circumstances, and an object of the invention is therefore to provide a solid-state imaging device in which the color contamination can be suppressed to such a level as to cause no problems in practice even in the case where the size of each pixel portion is as small as around 1 μm, as well as an imaging apparatus having such a solid-state imaging device.

The solid-state imaging device according to the invention is a solid-state imaging device having many pixel portions which are arranged over a substrate, wherein each of the pixel portions comprises a photoelectric conversion portion provided over the substrate and a color filter provided over the photoelectric conversion portion; and the solid-state imaging device comprises partitions for preventing light that is incident on the color filter of each pixel portion from entering adjacent pixel portions.

This configuration can prevent light incident on an arbitrary pixel portion from leaking into adjacent pixel portions and hence can suppress color contamination.

In the solid-state imaging device according to the invention, the partitions are provided between the color filters of the adjoining pixel portions so as to cover side surfaces of the color filters.

In the solid-state imaging device according to the invention, the partitions are made of a light absorbing or reflecting material or are air layers that reflect light totally.

In the solid-state imaging device according to the invention, the photoelectric conversion portions are photodiodes which are formed in a semiconductor substrate provided on a substrate in which circuits for outputting signals corresponding signal charges generated in the photoelectric conversion portions are formed.

In the solid-state imaging device according to the invention, each of the photoelectric conversion portions comprises a lower electrode provided over the substrate, an upper electrode provided over the lower electrode, and a photoelectric conversion layer provided between the lower electrode and the upper electrode; each of the pixel portions further comprises a protective layer provided between the color filter and the upper electrode, for protecting the photoelectric conversion portion; and the partitions also exist between the protective layers of the adjoining pixel portions.

In the solid-state imaging device according to the invention, the partitions also exist between the photoelectric conversion portions of the adjoining pixel portions.

In the solid-state imaging device according to the invention, the photoelectric conversion layer is made of a photoelectric conversion material that absorbs visible light and generates signal charges corresponding to an amount of the absorbed light; and the color filters of the pixel portions include three or more kinds of color filters that transmit light components in different wavelength ranges.

In the solid-state imaging device according to the invention, the photoelectric conversion layer is made of an organic or inorganic photoelectric conversion material.

In the solid-state imaging device according to the invention, each of the pixel portions further comprises a microlens provided on the color filter, for focusing light in the photoelectric conversion portion.

The imaging apparatus according to the invention comprises any of the above solid-state imaging devices.

The invention can provide a solid-state imaging device in which the color contamination can be suppressed to such a level as to cause no problems in practice even in the case where the size of each pixel portion is as small as around 1 μm, as well as an imaging apparatus having such a solid-state imaging device.

DETAILED DESCRIPTION OF THE INVENTION

A solid-state imaging device according to an embodiment of the present invention will be hereinafter described with reference to the drawings. This solid-state imaging device is for use in imaging apparatus such as digital cameras and digital video cameras.

Figure 1:
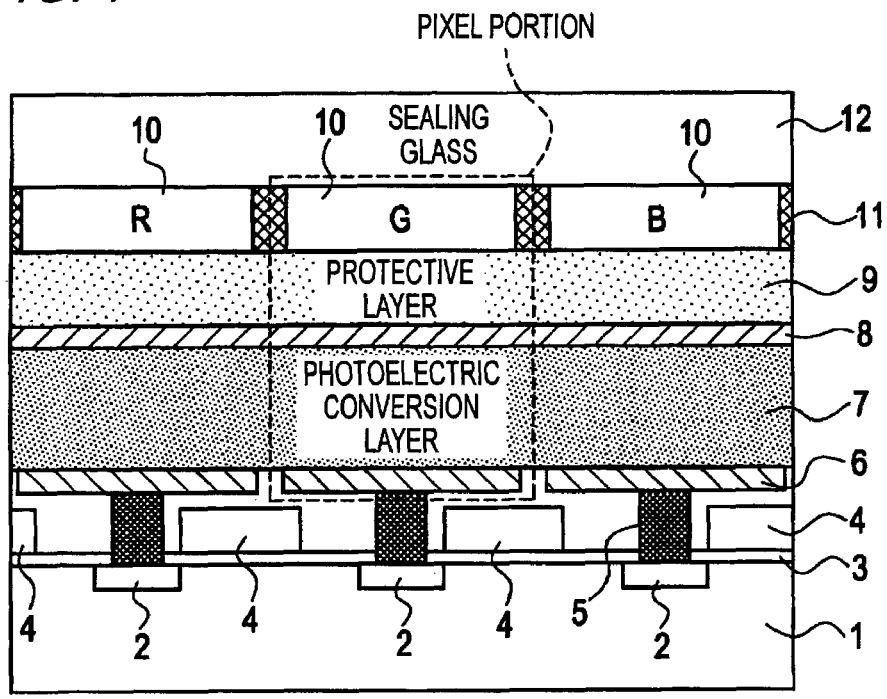
FIG. 1 is a schematic sectional view showing a general configuration of a solid-state imaging device according to an embodiment of the present invention.

FIG. 1 is a schematic sectional view showing a general configuration of the solid-state imaging device according to the embodiment of the invention. In the solid-state imaging device of FIG. 1, many pixel portions are disposed over a p-type silicon substrate 1 (an example of the term "substrate" as used in the claims) so as to be arranged two-dimensionally (e.g., in square matrix) or one-dimensionally. For example, the pixel portions are rectangular in shape. FIG. 1 includes a cross section of three pixel portions that are arranged in a prescribed direction.

Each pixel portion is provided with a photoelectric conversion portion including a lower electrode 6 disposed over the p-type silicon substrate 1, an upper electrode 8 disposed over the lower electrode 6, and a photoelectric conversion layer 7 disposed between the lower electrode 6 and the upper electrode 8, a protective layer 9 formed on the upper electrode 8, and a color filter 10 formed on the protective layer 9.

The lower electrodes 6 are made of aluminum, titanium nitride, or the like and are opaque to incident light. The lower electrodes 6 are separated from each other so as to correspond to the respective pixel portions.

The photoelectric conversion layer 7 is made of a photoelectric conversion material that absorbs visible light and generates signal charges corresponding to the amount of absorbed light. The photoelectric conversion material can be a known organic or inorganic material. Although in the embodiment the photoelectric conversion layer 7 is a single layer that is common to all the pixel portions, separate photoelectric conversion layers may be provided so as to correspond to the respective pixel portions.

The upper electrode 8 is made of ITO or the like and is transparent to incident light, and is a single electrode that is common to all the pixel portions. Alternatively, separate upper electrodes may be provided so as to correspond to the respective pixel portions. A prescribed bias voltage can be applied to the upper electrode 8 so that an electric field develops across the photoelectric conversion layer 7.

The protective layer 9, which serves to protect the photoelectric conversion portions, is made of, for example, an insulative material that is transparent to incident light. Where the protective layer 9 is made of an organic material, consideration should be given to the fact that organic materials are not suitable for photolithography because in general their characteristics are degraded to a large extent when they are exposed to water or a solvent. Since photolithography is generally used in forming the color filters 10, the characteristics of the photoelectric conversion layer 7 would be degraded if the protective layer 9 were not used. In view of the above, in the solid-state imaging device of FIG. 1, the protective layer 9 is provided between the photoelectric conversion layer 7 and the color filters 10. The protective layer 9 may be an alumina layer, a nitride layer, or the like.

The color filters 10 include three kinds of color filters, that is, R color filters which transmit light in the red (R) wavelength range, G color filters which transmit light in the green (G) wavelength range, and B color filters which transmit light in the blue (B) wavelength range. The large number of pixel portions are composed of pixel portions each having an R color filter, pixel portions each having a G color filter, and pixel portions each having a B color filter, and are arranged in a prescribed pattern so as to be able to generate a color image.

Charge storage portions 2, which are high-concentration n-type impurity layers, are formed in the p-type silicon substrate 1 so as to correspond to the respective pixel portions. Each charge storage portion 2, which serves to store signal charges generated in that portion of the photoelectric conversion layer which corresponds to the associated pixel portion, is electrically connected to the lower electrode 6 of the associated pixel portion via a plug 5 which is made of a conductive material such as tungsten.

Signal readout circuits 4 are also formed in the p-type silicon substrate 1 so as to correspond to the respective charge storage portions 2. The signal readout circuits 4, each of which serves to output a voltage signal corresponding to the signal charge stored in the associated charge storage portion 2, may be, for example, circuits using CMOS circuits or a CCD and an amplifier.

Figure 2:
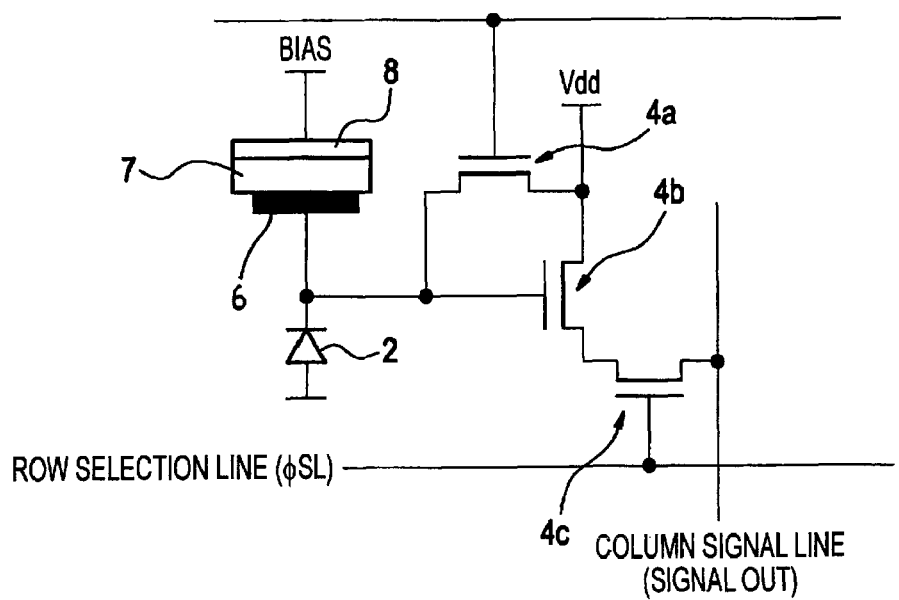
FIG. 2 shows an example configuration of each signal readout circuit shown in FIG. 1.

FIG. 2 shows an example configuration of each signal readout circuit 4 shown in FIG. 1.

As shown in FIG. 2, each signal readout circuit 4 has a known 3-transistor configuration including a reset transistor 4a for resetting the signal charge stored in the charge storage portion 2, an output transistor 4b for converting the signal charge stored in the charge storage portion 2 into a voltage signal, and a selection transistor 4c for outputting the output voltage signal of the output transistor 4b to a column signal line. A gate oxide layer of the transistors 4a, 4b, and 4c is formed on the p-type silicon substrate 1. The gate oxide layer 3 is made of silicon oxide, for example.

The solid-state imaging device of FIG. 1 is provided with partitions 11 for preventing a phenomenon that light incident on the color filter 10 of an arbitrary pixel portion enters adjacent pixel portions. The partitions 11 are provided between the color filters of the adjoining pixel portions so as to cover the side surfaces of the color filters 10.

It suffices that the partitions 11 constitute regions that absorb or reflect incident light. And the partitions 11 may be made of a material that absorb or reflect incident light (e.g., a metal such as tungsten or aluminum or a black dye or pigment) or may be air layers which reflect incident light totally. To reflect incident light totally, each air layer should satisfy a condition $\sin(90°-\alpha)>1/n$ where $\alpha$ is the angle of incidence of the incident light on the color filter 10 of a pixel portion and n is the refractive index of the air layer. For example, where n=1.5, the condition is satisfied when $\alpha$ is smaller than 48.2°. This means that almost all of oblique light can be reflected totally.

A sealing glass 12 for sealing the entire solid-state imaging device is provided on the color filters 10 and the partitions 11.

The operation of the above-configured solid-state imaging device will be described below.

R light of incident light passes through the R color filter 10 and enters that portion of the photoelectric conversion layer 7 which is located right under the R color filter 10, whereby signal charges are generated there according to the amount of the R light. G light of the incident light passes through the G color filter 10 and enters that portion of the photoelectric conversion layer 7 which is located right under the G color filter 10, whereby signal charges are generated there according to the amount of the G light. B light of the incident light passes through the G color filter 10 and enters that portion of the photoelectric conversion layer 7 which is located right under the B color filter 10, whereby signal charges are generated there according to the amount of the B light. Part of light that is incident on each color filter 10 obliquely is absorbed or reflected by the partition 11 covering the side surfaces of the color filter 10, whereby the amount of light that reaches the adjacent pixel portions is reduced.

The signal charges generated in each portion of the photoelectric conversion layer 7 are collected by the lower electrode 6 because of the electric field developing there, moved to the charge storage portion 2 via the plug 5, and stored in the charge storage portion 2. The signal charges stored in the charge storage portions 2 are read out sequentially to the column signal line as voltage signals by the signal readout circuits 4. Color image data can be generated by performing prescribed signal processing on the voltage signals that are output from the solid-state imaging device.

As described above, by virtue of the partitions 11 provided between the color filters 10, the solid-state imaging device of FIG. 1 can reduce the probability that light incident on the color filter 10 of an arbitrary pixel portion enters the pixel portions adjacent to it. This suppresses color contamination and hence makes it possible to realize a solid-state imaging device capable of high-image-quality imaging. Where the size of each pixel portion (i.e., the length of each sideline in the case where each pixel portion is square) is less than 2 μm, the length from the bottom surface of the photoelectric conversion layer 7 to the top surfaces of the color filters 10 is comparable to the size of each pixel portion and the probability of leakage of oblique incident light into adjacent pixel portions is increased. Reducing the probability of leakage of oblique incident light into adjacent pixel portions by providing the partitions 11 makes it possible to maintain the image quality even in the case where the degree of miniaturization is increased.

The partitions 11 can be formed by forming R color filters, G color filters, and B color filters in order on the protective layer 9, forming openings at the boundary portions between the color filters 10, and forming a sealing glass 12 after filling the openings with a light reflecting or absorbing material or with the openings left as they are. Alternatively, the partitions 11 may be formed on the protective layer 9 with a light reflecting or absorbing material, followed by filling the spaces surrounded by the partitions 11 with color filters 10. These manufacturing methods can prevent the color filters 10 of the different colors from overlapping with each other at the boundary portions, and hence can prevent color contamination more reliably. Where the partitions 11 are air layers, the manufacturing process can be simplified, resulting in a reduction in manufacturing cost.

Solid-state imaging devices having different configurations than shown in FIG. 1 will be described below.

Figure 3:
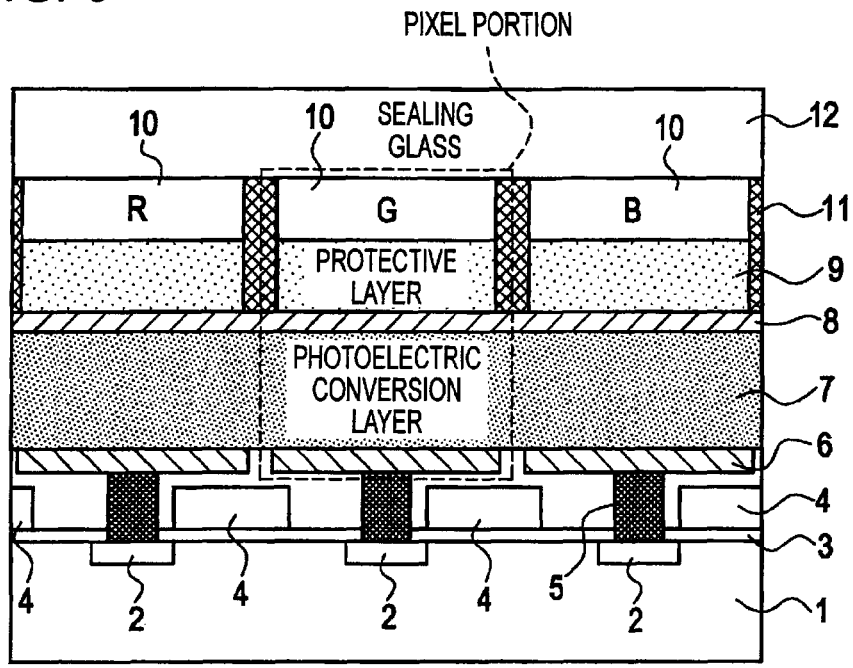
FIG. 3 is a schematic sectional view of a solid-state imaging device having a different configuration (modified configuration (1)) than shown in FIG. 1.

FIG. 3 is a schematic sectional view of a solid-state imaging device having a different configuration (modified configuration (1)) than shown in FIG. 1. The solid-state imaging device of FIG. 3 is different from that of FIG. 1 in that the partitions 11 are extended to the top surface of the upper electrode 8 so as to be located between the adjoining protective layers as well as between the color filters 10 of the adjoining pixel portions. This configuration makes it possible to further lower the probability that light incident on each pixel portion leaks into the adjacent pixels portions.

Figure 4:
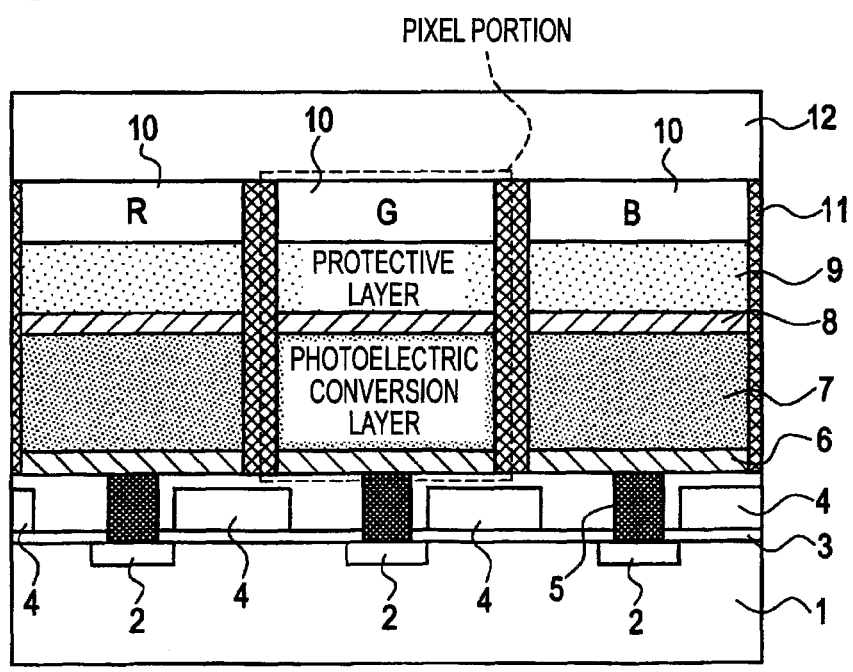
FIG. 4 is a schematic sectional view of a solid-state imaging device having a different configuration (modified configuration (2)) than shown in FIG. 1.

FIG. 4 is a schematic sectional view of a solid-state imaging device having a different configuration (modified configuration (2)) than shown in FIG. 1. The solid-state imaging device of FIG. 4 is different from that of FIG. 1 in that the partitions 11 are extended to the level of the bottom surfaces of the lower electrodes 6 so as to be located between the adjoining protective layers and between the adjoining photoelectric conversion portions as well as between the color filters 10 of the adjoining pixel portions. This configuration makes it possible to further lower the probability that light incident on each pixel portion leaks into the adjacent pixels portions.

In the configuration of FIG. 4, it is preferable that the partitions 11 be made of a non-conductive material because electrical continuity would be established between the lower electrodes 6 if the partitions 11 were made of a conductive material. The partitions 11 can be made of a conductive material if they are extended only to such an extent as not to contact the lower electrodes 6, if they are made so thin as not to be in contact with the lower electrodes 6, or if the gaps between the lower electrodes 6 are set large.

Figure 5:
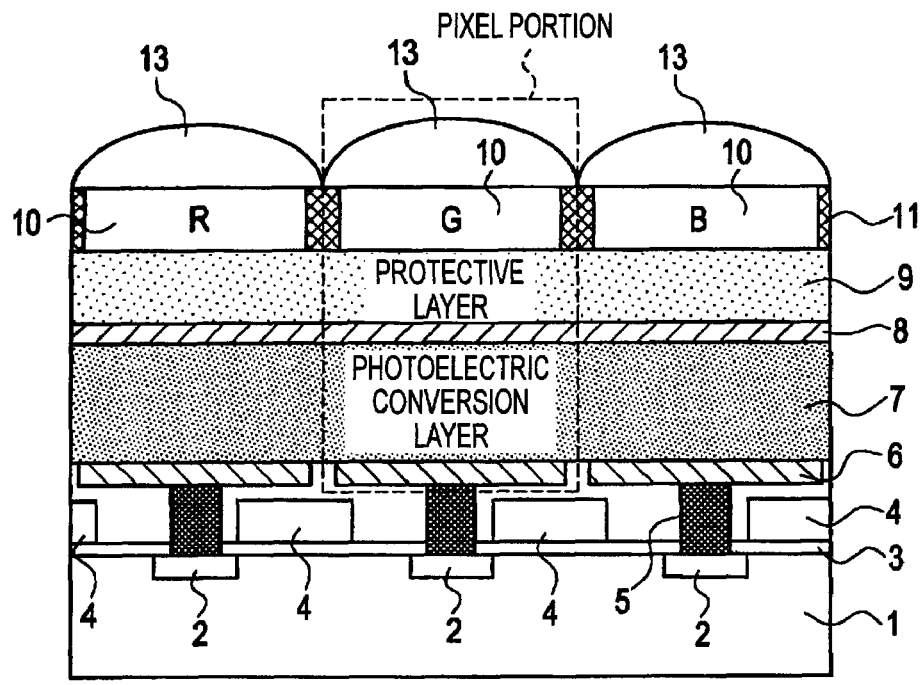
FIG. 5 is a schematic sectional view of a solid-state imaging device having a different configuration (modified configuration (3)) than shown in FIG. 1.

FIG. 5 is a schematic sectional view of a solid-state imaging device having a different configuration (modified configuration (3)) than shown in FIG. 1. The solid-state imaging device of FIG. 5 is different from that of FIG. 1 in that each pixel portion is provided with a microlens 13 on the color filter 10. The microlenses 13 serve to focus incident light at positions that are located in those portions of the photoelectric conversion layer 7 which correspond to the respective pixel portions. More specifically, the microlenses 13 are designed so as to focus incident light at positions that are located at the centers of those portions of the photoelectric conversion layer 7 which correspond to the respective pixel portions.

In the configuration of FIG. 5, the microlenses 13 make it possible not only to further lower the probability that light incident on each pixel portion leaks into the adjacent pixels portions but also to efficiently collect light in the photoelectric conversion layer 7, which means more reliable prevention of color contamination and increased efficiency of light utilization.

Figure 6:
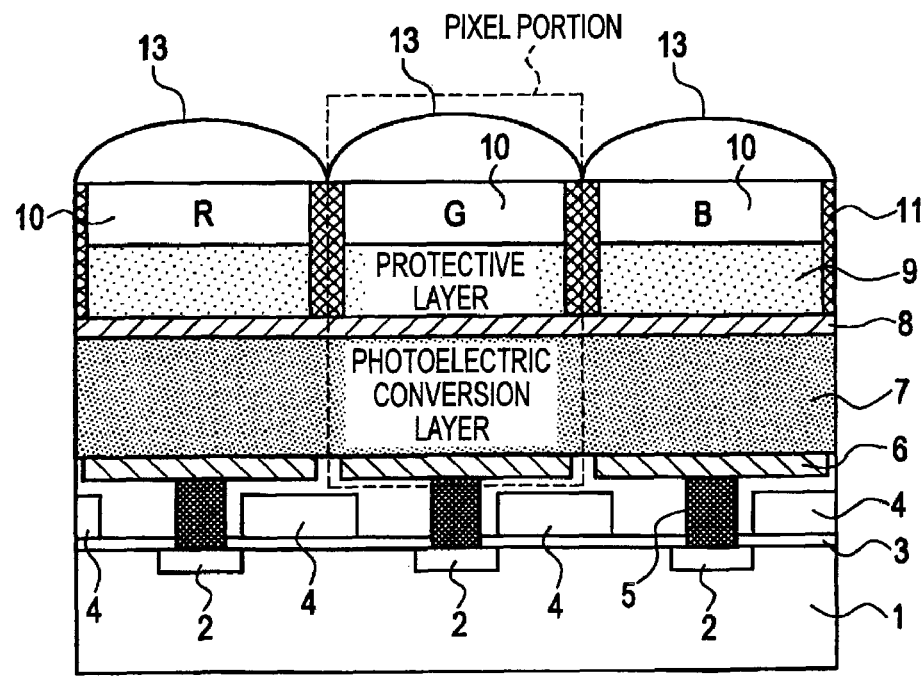
FIG. 6 is a schematic sectional view of a solid-state imaging device having a different configuration (modified configuration (4)) than shown in FIG. 1.

FIG. 6 is a schematic sectional view of a solid-state imaging device having a different configuration (modified configuration (4)) than shown in FIG. 1. The solid-state imaging device of FIG. 6 is different from that of FIG. 3 in that each pixel portion is provided with a microlens 13 on the color filter 10. The microlenses 13 serve to focus incident light at positions that are located in those portions of the photoelectric conversion layer 7 which correspond to the respective pixel portions. More specifically, the microlenses 13 are designed so as to focus incident light at positions that are located at the centers of those portions of the photoelectric conversion layer 7 which correspond to the respective pixel portions.

In the configuration of FIG. 6, the microlenses 13 make it possible not only to further lower the probability that light incident on each pixel portion leaks into the adjacent pixels portions but also to efficiently collect light in the photoelectric conversion layer 7, which means more reliable prevention of color contamination and increased efficiency of light utilization.

Figure 7:
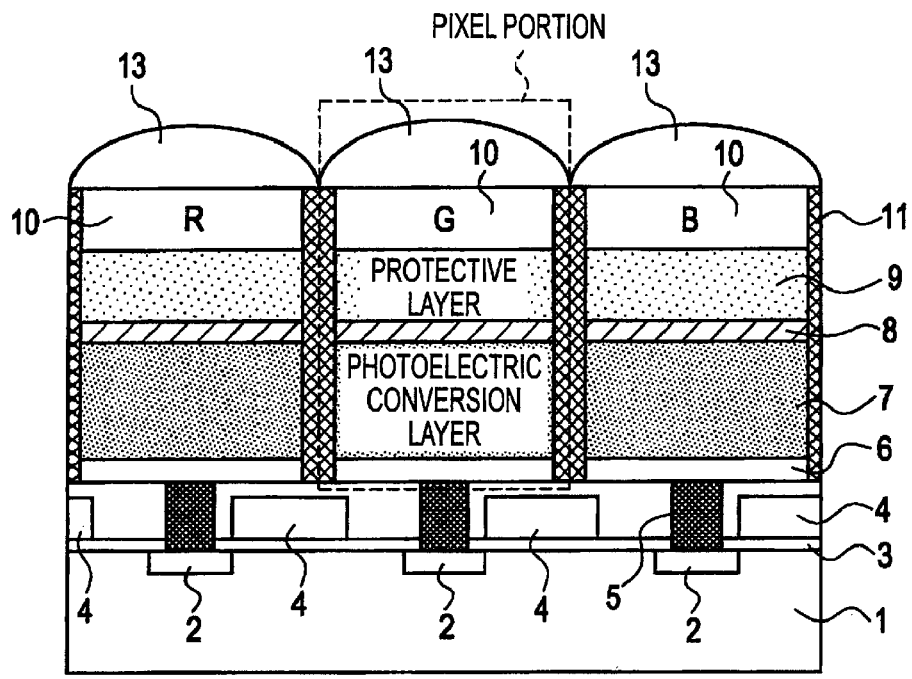
FIG. 7 is a schematic sectional view of a solid-state imaging device having a different configuration (modified configuration (5)) than shown in FIG. 1.

FIG. 7 is a schematic sectional view of a solid-state imaging device having a different configuration (modified configuration (5)) than shown in FIG. 1. The solid-state imaging device of FIG. 7 is different from that of FIG. 4 in that each pixel portion is provided with a microlens 13 on the color filter 10. The microlenses 13 serve to focus incident light at positions that are located in those portions of the photoelectric conversion layer 7 which correspond to the respective pixel portions. More specifically, the microlenses 13 are designed so as to focus incident light at positions that are located at the centers of those portions of the photoelectric conversion layer 7 which correspond to the respective pixel portions.

In the configuration of FIG. 7, the microlenses 13 make it possible not only to further lower the probability that light incident on each pixel portion leaks into the adjacent pixels portions but also to efficiently collect light in the photoelectric conversion layer 7, which means more reliable prevention of color contamination and increased efficiency of light utilization.

Figure 8:
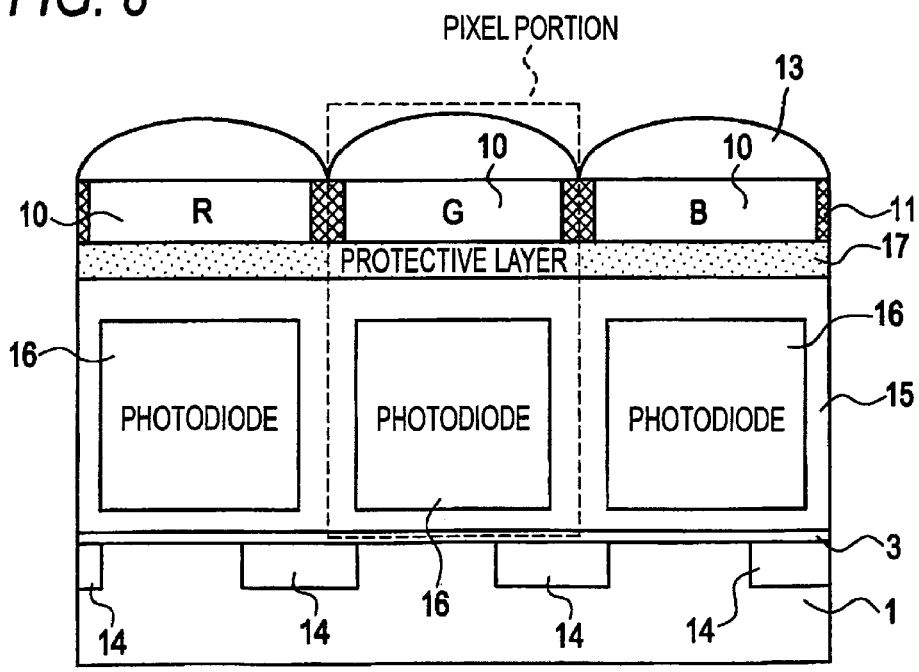
FIG. 8 is a schematic sectional view of a solid-state imaging device having a different configuration (modified configuration (6)) than shown in FIG. 1.

FIG. 8 is a schematic sectional view of a solid-state imaging device having a different configuration (modified configuration (6)) than shown in FIG. 1. The solid-state imaging device of FIG. 7 is different from that of FIG. 5 in that the protective layers 9, the upper electrode 8, the photoelectric conversion layer 7, the lower electrodes 6, the plugs 5 the signal readout circuits 4, and the charge storage portions 2 are removed and a silicon substrate 15 and a protective layer 17 are provided between the gate oxide layer 3 and the color filters 10.

The silicon substrate 15 is a p-type silicon substrate, for example, and is formed on the gate oxide layer 3. N-type impurity layers are formed in the silicon substrate 15 so as to correspond to the respective pixel portions, whereby pn junction photodiodes 16 are formed. The protective layer 17 is formed on the silicon substrate 15 and the color filters 10 and the partitions 11 are provided on the protective layer 17.

Signal readout circuits 14 are formed in the p-type silicon substrate 1 so as to correspond to the respective pixel portions. Each signal readout circuit 14 serves to output a signal corresponding to signal charges generated in the photodiode 16 of the associated pixel portion and may have the same configuration as each signal readout circuit 4.

In the solid-state imaging device of FIG. 8, light focused by each microlens 13 passes through the color filter 10 and enters the photodiode 16 of the associated pixel portion. And a signal corresponding to signal charges generated in the photodiode 16 is output to the outside via the signal readout circuit 14. This solid-state imaging device is what is called a back illumination imaging device in which light is applied from the photodiode side, which is different from a common solid-state imaging device in which photodiodes and signal readout circuits are formed in a silicon substrate and light is applied from the signal readout circuit side.

In the common solid-state imaging device, color filters 10 and microlenses 13 are provided on the bottom surface of the substrate 1 shown in FIG. 8 and light is applied to the microlenses 13. In contrast, in the back illumination solid-state imaging device, the color filters 10 and the microlenses 13 are provided on the surface that is distant from the signal readout circuits 14 formed in the silicon substrate 15 and light is applied to the microlenses 13. For example, this configuration provides advantages that large photodiodes 16 can be formed and that the efficiency of light utilization can be increased because part of light to enter each photodiode 16 is not interrupted by the readout circuit 14.

On the other hand, it can be said that the back illumination solid-state imaging device is prone to color contamination due to oblique incident light because the silicon substrate 15 should have a certain thickness. In this respect, it is particularly effective to provide the partitions 11 between the adjoining color filters 10.

The color filters 10 of the solid-state imaging device may be four or more kinds of color filters that transmit light components in different wavelength ranges.

Although the invention has been described above in relation to preferred embodiments and modifications thereof, it will be understood by those skilled in the art that other variations and modifications can be effected in these preferred embodiments without departing from the scope and spirit of the invention.

What is claimed is:

1. A solid-state imaging device comprising:
a substrate;
a plurality of pixel portions arranged over the substrate, wherein:
each of the pixel portions includes a photoelectric conversion portion provided over the substrate and a color filter provided over the photoelectric conversion portion;
each of the photoelectric conversion portions includes a lower electrode provided over the substrate, an upper electrode provided over the lower electrode, and a photoelectric conversion layer provided between the lower electrode and the upper electrode; the lower electrode is divided to correspond to the respective pixel portions, the photoelectric conversion layer is a single layer that is common to all the pixel portions, the upper electrode is a single electrode that is common to all the pixel portions, and each of the pixel portions has a size of 2 μm or less; and
partitions for preventing light that is incident on the color filter of each pixel portion from entering adjacent pixel portions;
wherein the partitions are provided between the color filters of the adjoining pixel portions so as to cover side surfaces of the color filters; and
the partitions are made from a light absorbing or reflecting material or are air layers that reflect light totally.

2. The solid-state imaging device according to claim 1, wherein:
each of the pixel portions further comprises a protective layer provided between the color filter and the upper electrode, for protecting the photoelectric conversion portion; and
the partitions also exist between the protective layers of the adjoining pixel portions.

3. The solid-state imaging device according to claim 2, wherein:
the photoelectric conversion layer is made from a photoelectric conversion material that absorbs visible light and generates signal charges corresponding to an amount of the absorbed light; and
the color filters of the pixel portions include three or more kinds of color filters that transmit light components in different wavelength ranges.

4. The solid-state imaging device according to claim 1, wherein:
the photoelectric conversion layer is made from a photoelectric conversion material that absorbs visible light and generates signal charges corresponding to an amount of the absorbed light; and
the color filters of the pixel portions include three or more kinds of color filters that transmit light components in different wavelength ranges.

5. The solid-state imaging device according to claim 1, wherein the photoelectric conversion layer is made from an organic or inorganic photoelectric conversion material.

6. The solid-state imaging device according to claim 1, wherein each of the pixel portions further comprises a microlens provided on the color filter, for focusing light in the photoelectric conversion portion.

7. An imaging apparatus comprising the solid-state imaging device according to claim 1.

* * * * *